(12) United States Patent
Takagi

(10) Patent No.: US 7,303,408 B2
(45) Date of Patent: Dec. 4, 2007

(54) CONNECTOR

(75) Inventor: Yoshikazu Takagi, Osaka (JP)

(73) Assignee: J.S.T. Manufacturing Co., Ltd., Osaka (JP)

( * ) Notice: Subject to any disclaimer, the term of this patent is extended or adjusted under 35 U.S.C. 154(b) by 0 days.

(21) Appl. No.: 11/183,710

(22) Filed: Jul. 18, 2005

(65) Prior Publication Data
US 2006/0019515 A1 Jan. 26, 2006

(30) Foreign Application Priority Data
Jul. 21, 2004 (JP) .............................. 2004-212531

(51) Int. Cl.
*H01R 12/00* (2006.01)
(52) U.S. Cl. ........................................ 439/79; 439/567
(58) Field of Classification Search .................. 439/79, 439/567, 607, 892
See application file for complete search history.

(56) References Cited
U.S. PATENT DOCUMENTS
4,722,691 A * 2/1988 Gladd et al. ................... 439/79
5,679,009 A * 10/1997 Okumura et al. ............. 439/79
5,827,076 A 10/1998 Chen
6,866,552 B2 * 3/2005 Koehler ....................... 439/892
2003/0166348 A1 9/2003 Martin et al.
2004/0023534 A1 2/2004 Sasame et al.
2005/0095882 A1 5/2005 Chen et al.

FOREIGN PATENT DOCUMENTS
JP 2004-63388 2/2004
WO WO-98/24156 6/1998

* cited by examiner

*Primary Examiner*—Khiem Nguyen
(74) *Attorney, Agent, or Firm*—Osha Liang LLP

(57) ABSTRACT

A connector with a locator, which prevents cracks at solder connected portions between pin contacts and a circuit board, prevents noise even in use in an environment with vibrations, and prevents deformation of the pin contacts is provided. The connector includes a plurality of pin contacts, a housing that houses and retains the rear ends of the pin contacts while leading out the front ends of the pin contacts in the same direction, and a resin-made plate-shaped locator that is attached to the housing and has a plurality of insertion holes for inserting the pin contacts to regulate the leading-out directions of the front ends of the pin contacts, wherein the locator is attached in contact with the housing side surface while its side end surface is in a warped condition.

4 Claims, 6 Drawing Sheets

CONNECTOR

BACKGROUND OF THE INVENTION

1. Field of the Invention

The present invention relates to a connector that is attached to a housing in a semi-fixed state and has a locator that prevents deformation of pin contacts.

2. Description of the Related Art

Conventionally, as connectors having a locator that prevents deformation of pin contacts, a fixed type connector that is fixed when being mounted on a circuit board, and a free type connector that is mounted by providing play horizontally and vertically to a circuit board without being fixed are generally known.

As a fixed type, for example, as disclosed in Japanese Patent Document 1 described below, an electrical connector formed so as to be connected to a circuit board is available, which includes a housing, a plurality of electrical connectors retained in the housing and having contact interfaces connectable to relative contact interfaces retained by the circuit board, and a contact guide having a plurality of openings aligned and fitted with the contact interfaces of the contacts, wherein the housing has a lock part formed so as to fit both the contact guide and the circuit board to fix the contact guide and the circuit board to the housing.

As a free type, for example, as disclosed in Patent Document 2 described below, a connector with a movable contact aligning part includes an insulating housing to be mounted on a circuit board, a plurality of contacts retained by the insulating housing, and a movable contact aligning member that aligns tines of the contacts, where the tines extend from the bottom of the insulating housing and are connected to through holes of the circuit board, wherein the insulating housing is further provided with a shield member that covers a part of the tines exposed between the insulating housing and the movable contact aligning member from the side of the insulating housing.

[Patent Document 1] Japanese Published Unexamined Patent Application No. 2003-257524

[Patent Document 2] Japanese Published Unexamined Patent Application No. 2004-63388

However, the connector of Patent Document 1 has a fixed locator, and this easily poses a problem in that the solder connected portions between the pin contacts and the circuit board easily crack due to a difference in thermal expansion and contraction caused by the difference in material from the circuit board, the electrical connection between the pin contact of the connector and a wiring pad on the circuit board becomes unstable, and the joint strength (peel strength) of the connector on the circuit board lowers and the connector comes off.

In order to prevent this problem, it is considered that the joint strength is increased by increasing the joint area at a reinforcing tab with the circuit board and increasing the solder amount to be used for joining, however, in this case, the electronic parts mounting effective area on the circuit board is reduced, and a large amount of solder is applied across a plurality of wiring patterns of fine wiring patterns of the circuit board, and this results in connection failure and is not preferable.

In addition, the connector of Patent Document 2 is provided with a locator while having play, so that when it is used in an environment with vibrations, the locator comes into contact with the pin contact and generates noise, and this noise may be taken for occurrence of a problem.

Therefore, an object of the invention is to provide a connector with a locator, which prevents cracks at the solder connected portions between the pin contacts and the circuit board, prevents noise even in use in an environment with vibrations, and prevents deformation of pin contacts.

SUMMARY OF THE INVENTION

A connector of the invention includes a plurality of pin contacts, a housing that houses and retains the rear ends of the pin contacts while leading out the front ends of the pin contacts in the same direction, and a resin-made plate-shaped locator that is attached to the housing and has a plurality of insertion holes for insertion of the pin contacts to regulate the leading-out directions of the front ends of the pin contacts, wherein the locator is attached in contact with the housing side surface while its side end surface is in a warped condition.

With the above-mentioned construction, the locator is rarely moved by a stress applied when it is attached to the housing. However, the resin of the material has properties in that it creeps by being heated under a stress loaded and makes the stress zero, so that the stress on the locator in contact with the housing side surface while its side end surface is in a warped condition, is reduced after reflow soldering, and the locator becomes slightly easier to move and is mounted on the circuit board. Therefore, a connector that produces such an effect after reflow soldering is provided.

A connector of the invention includes a plurality of pin contacts, a housing that houses and retains the rear ends of the pin contacts while leading out the front ends of the pin contacts in the same direction, and a resin-made plate-shaped locator that has a plurality of insertion holes through which the pin contacts are inserted to regulate the leading-out directions of the pin contacts, wherein the locator is attached while its side end surface is made in contact with the housing side surface with a pressing force that partially differs.

With the above-mentioned construction, the locator is rarely moved by a pressing force (stress) applied when it is attached to the housing. However, the resin of the material has properties in that it creeps by being heated under a stress loaded and makes the stress zero, so that the pressing force on the locator that is in contact with the housing side surface with the pressing force that partially differs is reduced after reflow soldering, and the locator becomes slightly easier to move and is mounted on a circuit board. Therefore, a connector that produces such an effect after reflow soldering is provided.

A connector of the invention includes a plurality of pin contacts, a housing that houses and retains the rear ends of the pin contacts while leading out the front ends of the pin contacts in the same direction, and a resin-made plate-shaped locator that has a plurality of insertion holes through which the pin contacts are inserted to regulate the leading-out directions of the pin contacts, wherein the locator is attached by partially pressing and contacting its side end surface with the housing side surface.

With the above-mentioned construction, the locator is rarely moved by a stress applied when it is attached to the housing. However, the resin of the material has properties in that it creeps by being heated under a stress loaded and makes the stress zero, so that the stress on the locator having the side end surface partially pressed and contacted with the housing side surface is reduced and the locator becomes slightly easier to move and is mounted on the circuit board. Therefore, a connector that produces such an effect after reflow soldering is provided.

Preferably, in the connector of the invention, the locator has a plurality of attaching hooks disposed at predetermined intervals on its side end surface, and the housing has, on its side surface, engaging parts to be engaged with the hooks inclined to the housing side surface for attachment.

With the above-mentioned construction, the side end portion of the locator is reliably in a warped condition, contacted with the housing side surface with a pressing force that partially differs, or is partially pressed and contacted with the housing side surface, so that the locator is rarely moved by a stress applied when the locator is attached to the housing. However, the resin of the material has properties in that it creeps by being heated under a stress loaded and makes the stress zero, so that the stress on the locator having a side end surface partially pressed and contacted with the housing side surface is reduced after reflow soldering, and the locator becomes slightly easier to move and is mounted on the circuit board. Therefore, a connector that produces such an effect after reflow soldering is provided.

Preferably, the connector of the invention has, on the other side surface continued to the side surface of the housing, a projection provided along one side surface of the locator.

With the above-mentioned construction, the locator side end portion opposite the housing is moderately prevented from moving toward the pin contact retaining side, whereby noise caused by contact with the pin contacts can be prevented.

DETAILED DESCRIPTION OF THE PREFERRED EMBODIMENTS

Next, an embodiment of the connector of the invention is described with reference to the drawings, however, the invention is not limited thereto. The terms relating to front and rear, left and right, and vertical directions used in the embodiment described below are used only for convenience of explanation.

Figure 1:
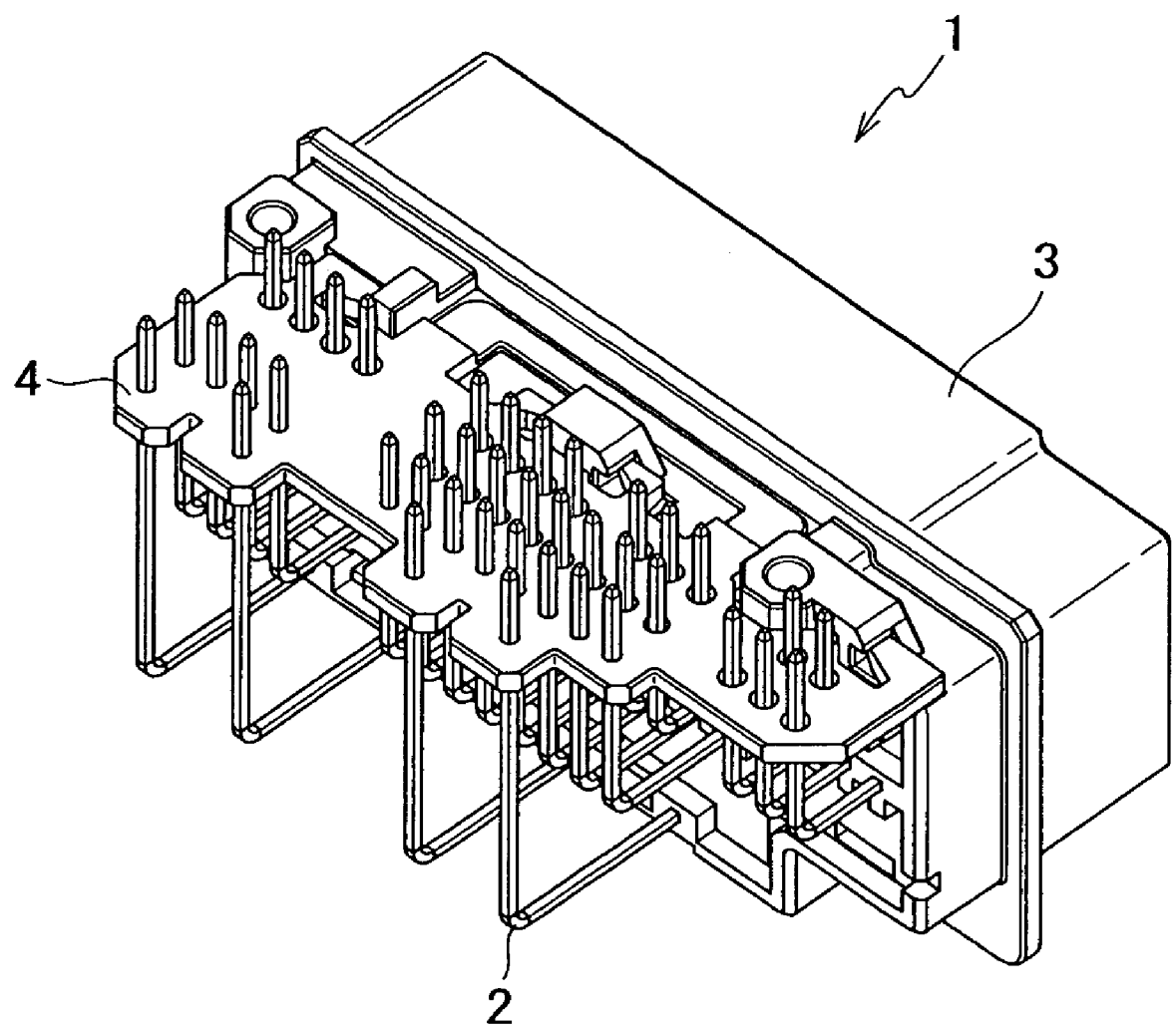
FIG. 1 is a perspective view showing a connector of this embodiment.
Figure 2:
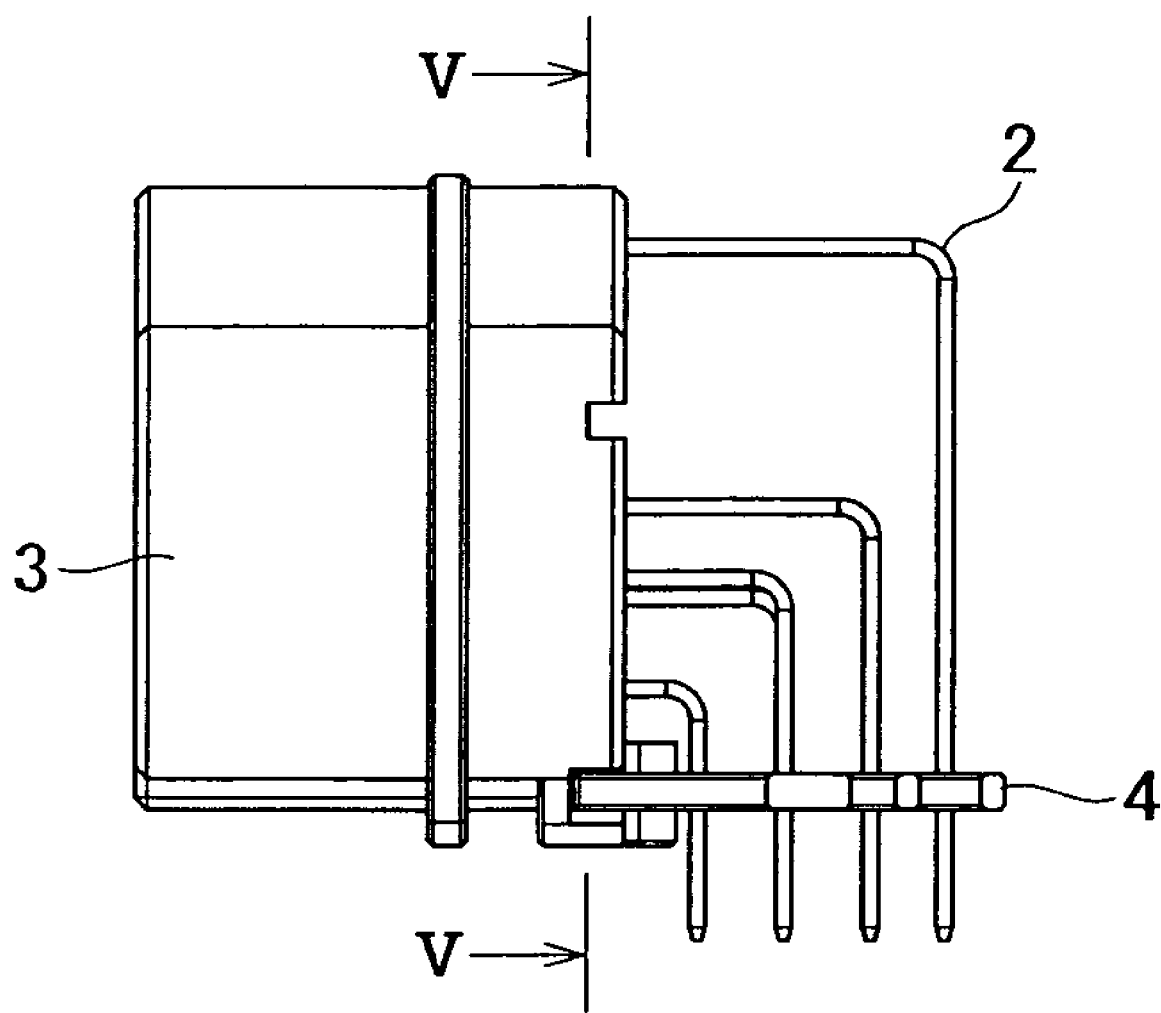
FIG. 2 is a end face view showing the connector of this embodiment.
Figure 3:
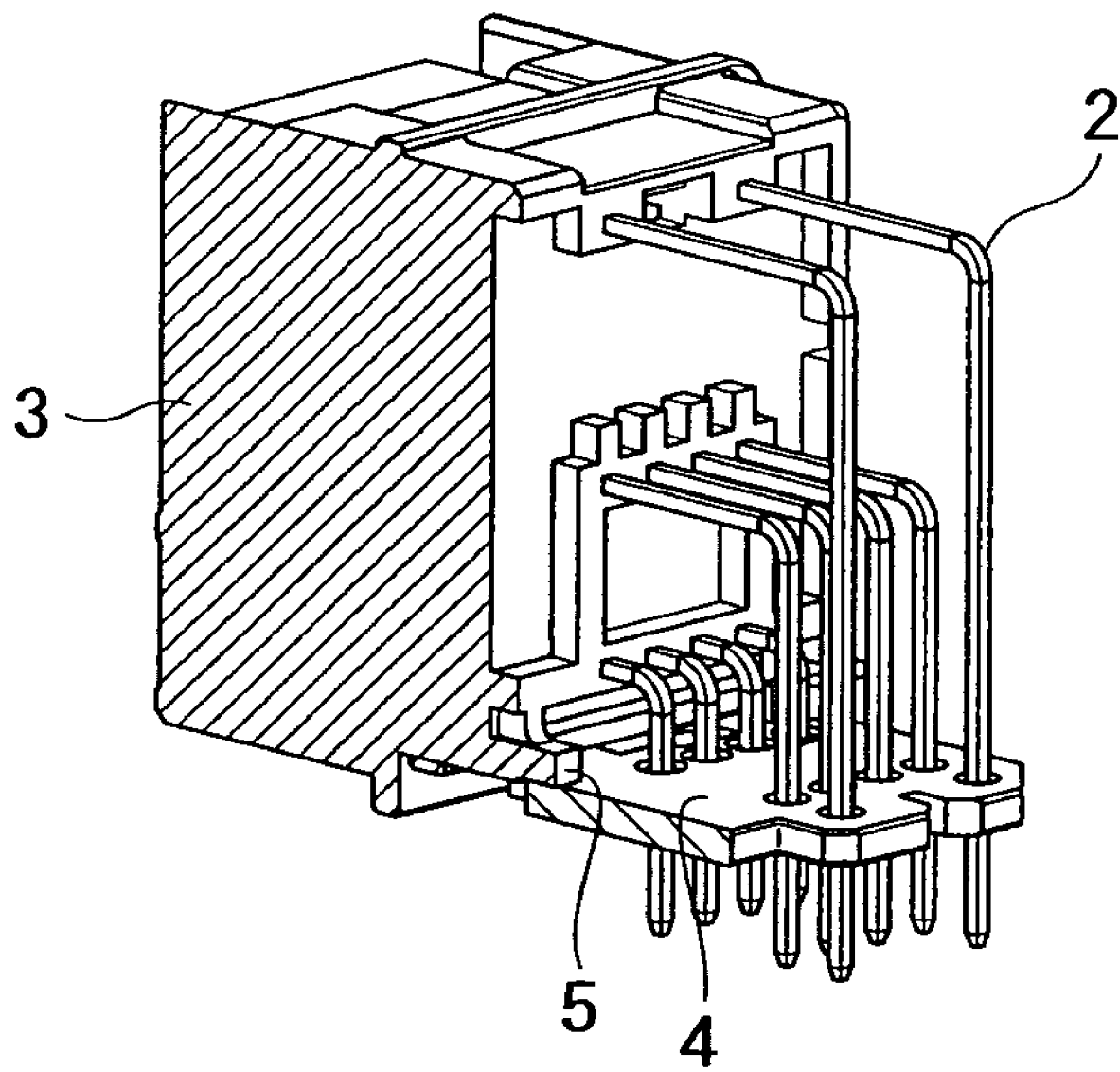
FIG. 3 is a perspective sectional view along the locator shorter-side at a projection when the locator of FIG. 1 is viewed from the opposite side.
Figure 4:
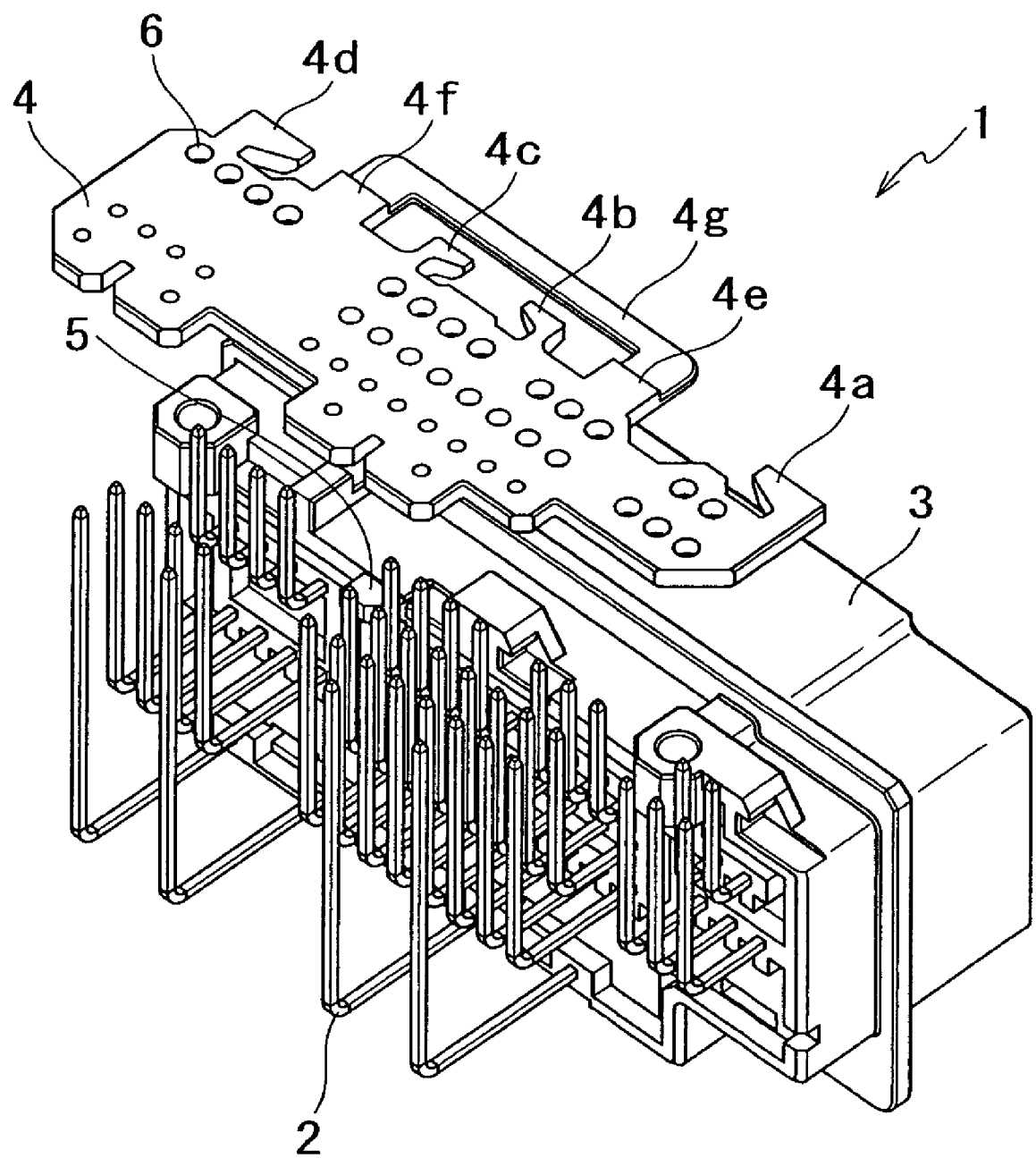
FIG. 4 is a perspective view of the connector of this embodiment before the locator is attached.
Figure 5:
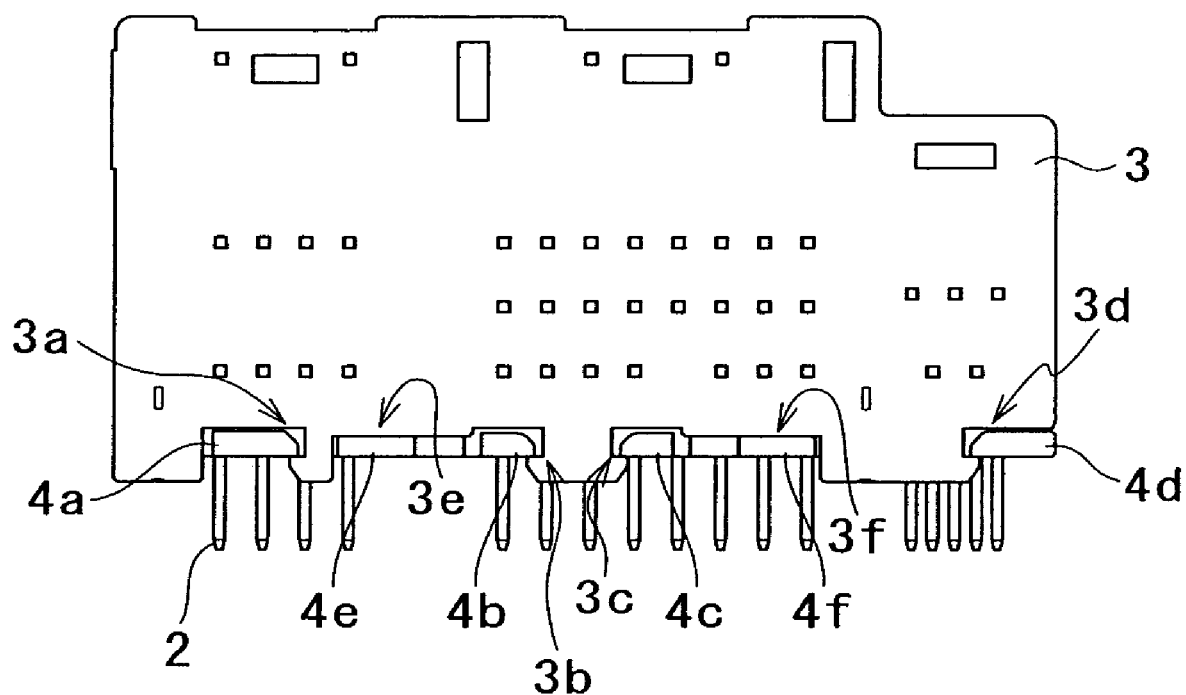
FIG. 5 is a sectional view on the V-V arrow of the connector of FIG. 2.
Figure 6:
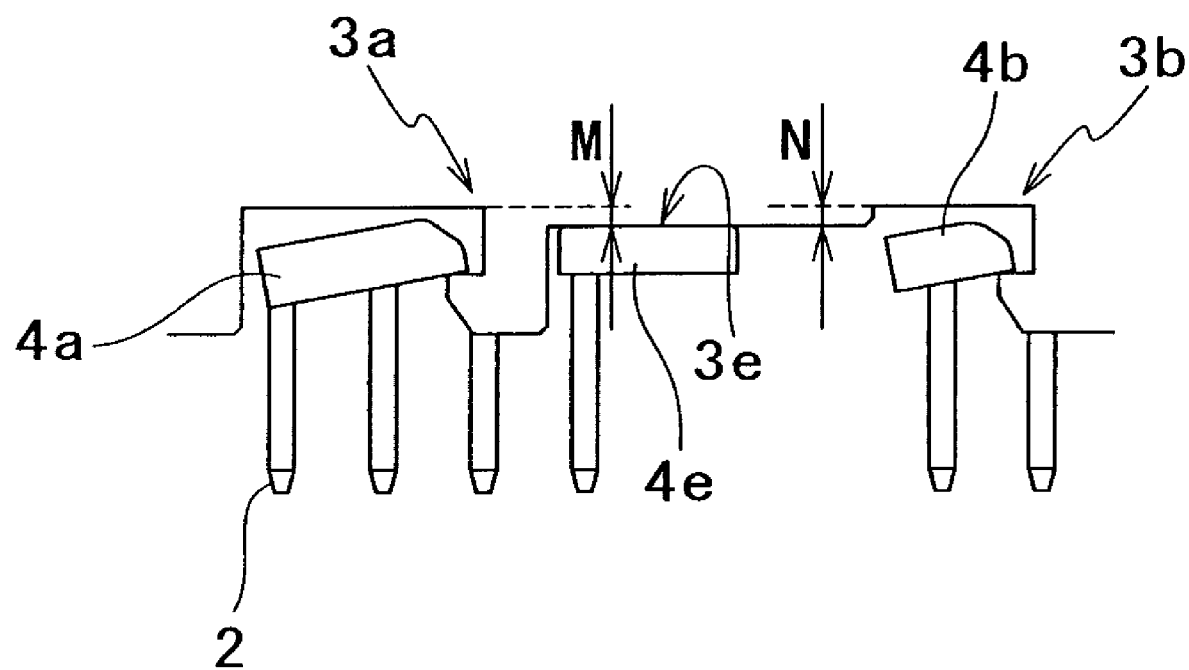
FIG. 6 is a partially enlarged sectional view of the connector of FIG. 5.

FIG. 1 is a perspective view showing a connector of this embodiment. FIG. 2 is an end face view showing the connector of this embodiment. FIG. 3 is a perspective sectional view along a locator shorter-side at a projection when the locator of FIG. 1 is viewed from the opposite side. FIG. 4 is a perspective view of the connector of the invention before the locator is attached. FIG. 5 is a sectional view on the V-V arrow of the connector of FIG. 2. FIG. 6 is a partially enlarged sectional view of the connector of FIG. 5.

The connector 1 has a plurality of metal-made pin contacts 2, a housing 3 formed by integral molding of an insulating resin, and a locator 4 formed of a plate-shaped member of an insulating resin.

The pin contacts 2 are aligned in four lines vertically at the rear surface portion of the housing 3 so that the rear ends thereof are housed and retained along the longitudinal direction of the housing 3. The pin contacts 2 have a spring-like feature, and the middle portions thereof are bent almost at right angles.

On the front side (not shown) of the housing 3, an opening (not shown) of the connector to which a socket side connector (not shown) to be connected to the connector is formed. On the bottom of the opening, terminals that come into contact with a plurality of terminals of the attached socket side connectors are arranged in a row along the longitudinal direction. On the edge of the pin contact 2 side of the side surface of the housing 3, engaging parts 3a, 3b, 3c, and 3d to be engaged with the hooks 4a, 4b, 4c, and 4d of the locator 4 described later are provided. The engaging parts 3a, 3b, 3c, and 3d are provided with recesses to make easier the engagement with the hooks 4a, 4b, 4c, and 4d, respectively (see FIG. 5). It is preferable that the recesses are formed on the side surface of the housing 3 so that the hooks 4a, 4b, 4c, and 4d are engaged inclined to the side surface of the housing 3 (see FIG. 6).

The sectional shape of the housing 3 side end portion is formed roughly irregularly as shown in FIG. 5 and FIG. 6. In detail, the side end portion is formed into rough irregularities so that the bottom of the engaging part 3a shown in FIG. 6 and the portion 3e to be contacted with the projection 4e of the locator 4 described later are at a distance M from each other, and the bottom of the engaging part 3b and the portion 3e to be contacted with the projection 4e of the locator 4 described later are at a distance N from each other. The distances M and N may be equal to each other. The relationship between the engaging parts 3c and 3d and the portion 3f to be contacted with the projection 4f of the locator 4 also has the same stepped sectional shape.

The surface with the pin contacts 2 of the housing 3 is provided with a projection 5 along one side surface of the locator 4 (see FIG. 3).

As a material of the housing 3, a thermoplastic resin of, for example, syndiotactic polystyrene, polyphenylene sulfide, 6T nylon, 46 nylon, etc., can be preferably used.

The locator 4 is a resin-made plate having a plurality of insertion holes 6 for inserting the pin contacts 2 to regulate the leading-out directions of the front ends of the pin contacts 2. This locator 4 includes hooks 4a, 4b, 4c, and 4d provided along its side end portion, a projection 4e provided between the hooks 4a and 4b, a projection 4f provided between the hooks 4c and 4d, and a plate part 4g having ends integrally molded with the projections 4e and 4f. The front ends of the hooks are provided toward the center side of the side end portion of the locator 4, and the hooks 4a and 4d are provided near the ends of the side end portion of the locator 4, and the hooks 4b and 4c are provided near the center of the side end portion of the locator 4 at a predetermined distance.

Next, the engagement of the locator 4 with the housing 3 is described. As described above, the bottom of the engaging part 3a and the portion 3e to be contacted with the projection 4e of the locator 4 described later, shown in FIG. 6, are at a distance M from each other, and the bottom of the engaging part 3b and the portion 3e to be contacted with the projection 4e of the locator 4 described later are at a distance N from each other. Therefore, when attaching the locator 4 to the housing 3, the hooks 4a, 4b, 4c, and 4d are engaged and attached to the side surface of the housing 3 so as to be inclined to the side surface of the housing 3. Thereby, the locator 4 can be contacted and attached to the side surface of the housing 3 while the side end surface of the locator 4 is in a warped condition. Furthermore, by increasing the warping degree of the side end surface of the locator 4, it also becomes possible that the locator is contacted with and attached to the side surface of the housing 3 by a pressing force that partially differs. It is also possible that the side end surface of the locator 4 on the housing 3 side is formed into irregularities and attached to the side surface of the housing 3 by being partially pressed and contacted although this is not shown.

In addition, the plate part 4g prevents the side end portion on the opposite side of the plate part 4g from moving upward in FIG. 1.

According to the connector 1 of this embodiment, the engaging parts 3a, 3b, 3c, and 3d and hooks 4a, 4b, 4c, and 4d are constructed as described above, so that the side end portion of the locator 4 is in a reliably warped condition, contacted with the side surface of the housing 3 with a pressing force that partially differs, or partially pressed and contacted with the side surface of the housing 3, and therefore, the locator 4 is rarely moved by a stress applied when it is attached to the housing 3. However, the resin of the material has properties in that it creeps by being heated under a stress loaded and makes the stress zero, so that the stress on the locator 4 having a side end surface partially pressed and contacted with the housing 3 side surface is reduced after reflow soldering, and the locator becomes slightly easier to move and is mounted on a circuit board (not shown). Therefore, a connector 1 that produces such an effect after reflow soldering is provided.

In addition, by providing the projection 5, the side end portion of the locator 4 on the opposite side of the housing 3 can be moderately prevented from moving toward the pin contact 2 retaining side even when the connector 1 is used in an environment with vibrations, whereby noise caused by contact with the pin contact 2 can be prevented.

What is claimed is:

1. A connector comprising
    a plurality of pin contacts,
    a housing that houses and retains rear ends of the pin contacts while leading out front ends of the pin contacts in the same direction, and
    a resin-made plate-shaped locator that is attached to the housing and has a plurality of insertion holes for inserting the pin contacts to regulate leading-out directions of the front ends of the pin contacts,
    wherein the locator is contacted and attached to a side surface of the housing through a side end surface of the locator while the side end surface is in a warped condition.

2. The connector according to claim 1, wherein the locator has a plurality of attaching hooks disposed at predetermined intervals on its side end surface, and the locator is attached to the housing by engaging the hooks with the side surface of the housing so as to be inclined to the side surface of the housing.

3. The connector according to claim 1, wherein on other side surface continued to the side surface of the housing, a projection along one side surface of the locator is provided.

4. The connector according to claim 2, wherein on other side surface continued to the side surface of the housing, a projection along one side surface of the locator is provided.

* * * * *